(12) United States Patent
Tsorng et al.

(10) Patent No.: US 12,232,292 B2
(45) Date of Patent: Feb. 18, 2025

(54) SMART POLE ASSEMBLY AND CABINET FOR SERVER

(71) Applicant: Quanta Computer Inc., Taoyuan (TW)

(72) Inventors: Yaw-Tzorng Tsorng, Taoyuan (TW); Ming-Lung Wang, Taoyuan (TW); Kai-Hsiang Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 247 days.

(21) Appl. No.: 17/979,275

(22) Filed: Nov. 2, 2022

(65) Prior Publication Data

US 2024/0147653 A1 May 2, 2024

(51) Int. Cl.
| | | |
|---|---|---|
| *H05K 7/18* | (2006.01) | |
| *E04H 12/00* | (2006.01) | |
| *H05K 5/02* | (2006.01) | |
| *H05K 7/14* | (2006.01) | |
| *H05K 7/20* | (2006.01) | |

(52) U.S. Cl.
CPC ........... *H05K 7/186* (2013.01); *E04H 12/003* (2013.01); *H05K 5/0213* (2013.01); *H05K 7/1489* (2013.01)

(58) Field of Classification Search
CPC .. H05K 7/186; H05K 7/1489; H05K 7/20572; H05K 5/0213; E04H 12/003
See application file for complete search history.

(56) References Cited

U.S. PATENT DOCUMENTS

| | | | | |
|---|---|---|---|---|
| 9,698,477 | B1* | 7/2017 | Jabara | E04H 12/342 |
| 2017/0020025 | A1* | 1/2017 | Huang | H05K 7/186 |
| 2017/0127548 | A1* | 5/2017 | Hewitt | H05K 7/183 |
| 2018/0175661 | A1* | 6/2018 | Tuerk | H02J 7/04 |
| 2020/0118054 | A1* | 4/2020 | Bayges | H04W 4/44 |
| 2021/0320393 | A1* | 10/2021 | Williams | E04H 12/24 |
| 2023/0320016 | A1* | 10/2023 | Aman | H05K 7/20736 312/223.2 |

* cited by examiner

*Primary Examiner* — Hoa C Nguyen
*Assistant Examiner* — Amol H Patel
(74) *Attorney, Agent, or Firm* — NIXON PEABODY LLP

(57) ABSTRACT

A smart pole assembly for a telecommunication network, a cabinet for enclosing computing equipment, and a method for installing computing equipment in a cabinet are disclosed. The smart pole assembly includes a cabinet and a case movably coupled to the cabinet and configured for receiving computing equipment. The case is movable between a first position and a second position. The first position is a service position in which the case is at least in part external to the cabinet, and the second position is a working position in which the case is within the cabinet in a rotated orientation relative to the first position. A method for installing computing equipment in a cabinet includes inserting computing equipment into the case that is in the first position and moving the case to the second position such that the case and computing equipment are in the rotated orientation within the cabinet.

20 Claims, 8 Drawing Sheets

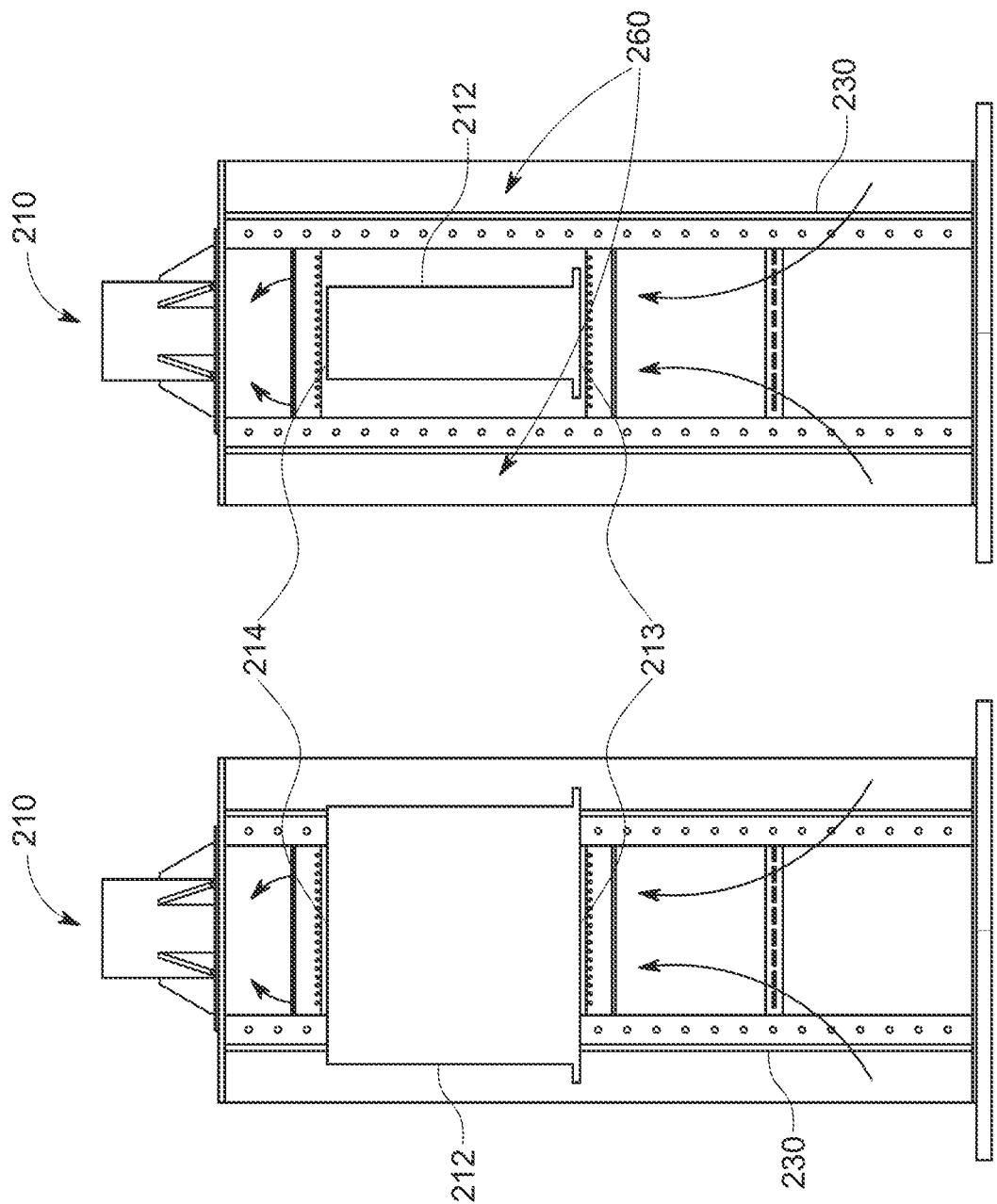

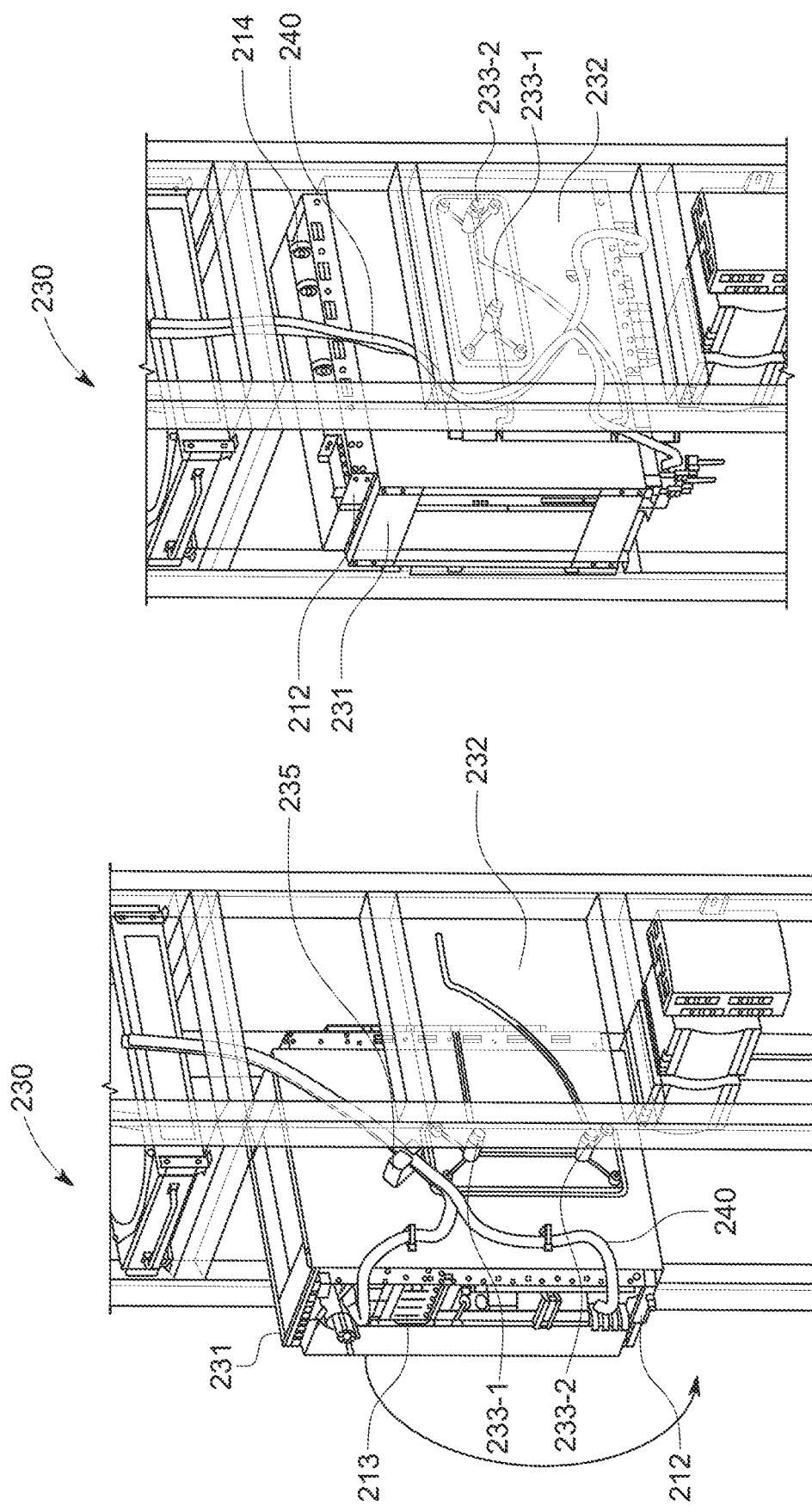

SMART POLE ASSEMBLY AND CABINET FOR SERVER

FIELD OF THE INVENTION

The present invention relates generally to a smart pole assembly for a telecommunication network, and more specifically, to a cabinet with a movable case and a method for installing computing equipment in a cabinet.

BACKGROUND OF THE INVENTION

Smart poles serve various functions by hosting a vast array of technologies such as cellular networks, internet of things (IoT), smart devices, and vehicle applications. As more technologies are incorporated into smart poles, the amount of devices and cables in cabinets of smart pole assemblies will also increase. As a result, more heat may be generated by the devices within the cabinet. In general, devices such as servers are mostly installed within the cabinet which is located outdoor or in the base of smart poles. Most existing outdoor cabinets are designed for 19" rack mount server.

In general, a smart pole assembly 100 has a base frame 101 and a pole 102 coupled to the base frame 101, as shown in FIG. 1A. The base frame 101 may include a first compartment 110 and a second compartment 120 for enclosing various equipment. As shown in FIG. 1B, each of the first compartment 110 and second compartment 120 has an opening providing access to the interior space and an openable cover 111, 121 for covering the opening. For example, the first compartment 110 may be used as a compartment holding various computing equipment such as an alarm interface block, an optical connector panel, a power rectifier, a baseband unit (BBU), power distribution connectors, a ground bar and/or a mobile edge computing module. The second compartment 120 may be used as a ventilated compartment holding equipment such as a Remote Radio Unit (RRU) 122. Thus, heat generated by the computing equipment held within the first compartment 110 may exit through the ventilated second compartment 120. Therefore, the air should move upward from the first compartment 110 toward the second compartment 120 to dissipate the generated heat. The efficiency of the airflow can be affected by the design of the cabinet within the first and/or second compartment.

For example, as shown in FIG. 1C, a cabinet or rack is provided within the first compartment 110 to hold computing equipment 112 such as servers or edge computing servers. Some outdoor cabinets are designed to roll the server 90 degrees to save the cabinet space and land area. Most servers installed within the outdoor cabinets are cooled by fans such that the direction of airflow is from the front to the rear of the servers or sideways. In this case, the cable plugs are accessed from the front or rear of the servers. Although rolling the server 90 degrees may save the spaces to the left and right, there is a need for keeping the front and rear spaces for cable routing and cooling.

While FIG. 1C is a front perspective view of the first compartment 110 with a cabinet within which computing equipment 112 is installed, FIG. 2 is a simplified side view of the cabinet shown in FIG. 1C including the computing equipment 112 installed therein. In FIG. 2, the left side and the right side of the computing equipment 112 are the front side and the rear side, respectively, of the computing equipment. Referring to FIG. 2, in the prior art outdoor cabinets 130, airflow is designed such that the initial direction of the airflow is sideways or in a lateral direction because the airflow inlet and outlet are located at the front and rear side, respectively, of the computing equipment 112. That is, the airflow inlet and outlet of computing equipment 112 or server are oriented sideways when the computing equipment is installed within the cabinet 130. Therefore, the airflow needs to be turned to direct the sideway airflow direction upwards in a limited space. The limited space within the base of the smart pole also needs to be used for cables in addition to the airflow. In such a condition, it is difficult to optimize the flow speed and rate of the airflow.

In the prior art cabinet 130 exemplified in FIG. 2, the installed computing equipment 112 is oriented such that the airflow inlet and airflow outlet are oriented horizontally or sideways. This is because the prior art cabinet 130 is designed such that the front side of the computing equipment 112 installed therein faces forward, the airflow inlet being positioned at the front side. Once the computing equipment 112 is installed within the prior art cabinet 130, the orientation of the computing equipment stays the same without being changed. As a result, the airflow direction is as shown in FIG. 2. Since the inner space of the cabinet 130 is blocked by the computing equipment 112, the air entering the airflow inlet cannot pass through the inner space of the cabinet, but must exit through the airflow outlet that is positioned at the other end of the cabinet. First, the airflow exiting from the airflow outlet can be directed upward through a space formed between the cabinet 130 and an inner surface of the first compartment 110 enclosing the cabinet. Then, the airflow can continue to be directed upward through a space above the computing equipment 112 within the cabinet to reach the second compartment 120, as shown in FIG. 2.

Therefore, a need exists for smart pole assemblies that allow for the change of the orientation of computing equipment or servers installed within a cabinet, causing change of the airflow direction as well. A need also exists for smart pole assemblies that have a more effective use of space.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a smart pole assembly for a telecommunication network is disclosed. According to various embodiments, the smart pole assembly includes a compartment having a hollow interior space, the compartment having an openable cover for covering an opening to the hollow interior space; a cabinet enclosed within the compartment, a space being formed between an inner surface of the compartment and the cabinet, the cabinet being accessible via the opening of the compartment; and a case movably coupled to the cabinet and configured for receiving computing equipment for operation with the telecommunication network. The case is movable between a first position and a second position in response to receiving an external force from a user. The first position is a service position in which the case is at least in part external to the cabinet, and the second position is a working position in which the case is within the cabinet in a rotated orientation relative to the first position.

In some examples, wherein a first side of the case faces a first direction when the case is in the first position. In some examples, a portion of the case including the first side protrudes from a front side of the cabinet when the case is in the first position. In some examples, the case is configured to receive the computing equipment through the first side of the case when the case is in the first position.

In some examples, a front side of the received computing equipment, at which an airflow inlet is located, faces the first direction when the case is in the first position. In some examples, the front side of the received computing equipment is directed downward toward ground or faces a second direction that is perpendicular to the first direction when the case is moved or rotated from the first position to the second position. In some examples, a rear side of the received computing equipment, at which an airflow outlet is located, is directed upward when the case is in the second position such that a direction of airflow is upward from the airflow inlet toward the airflow outlet.

In some examples, the cabinet includes a pair of panels and the movable case is positioned between the panels. In some examples, each of the panels includes a sliding track such that the case is slidably movable via the sliding tracks. In some examples, the case includes rollers slidably coupled to the sliding tracks.

In some examples, each panel includes two sliding tracks, a first sliding track being straight and a second sliding track being at least partially curved or angled with respect to the first sliding track. In some examples, the rollers of the case include a first roller slidably coupled to the first sliding track and a second roller slidably coupled to the second sliding track.

In some examples, the case is in the second position when the rollers of the case that is in the first position are slid to end points of the sliding tracks. In some examples, a first side of the case facing a first direction protrudes from a front side of the cabinet when the rollers of the case that is in the first position are positioned at starting points of the sliding tracks. In some examples, the first side of the case faces a second direction that is perpendicular to the first direction when the rollers are positioned at the end points of the sliding tracks and when the case is in the second position. In some examples, a second side of the case that is perpendicular to the first side of the case and facing the first direction does not protrude from the front side of the cabinet when the case is in the second position.

In some examples, the case is rotated when the rollers are slid along the sliding tracks from the starting points to the end points. In some examples, the case is in a vertical orientation when the rollers are at the starting points and when the case is in the first position; and the case is in a horizontal orientation when the rollers are at the end points and when the case is in the second position.

In some examples, a length of the first side of the case is greater than a length of the second side of the case. In some examples, the smart pole assembly further includes a cable holder coupled to the case and configured to hold a cable.

According to certain aspects of the present disclosure, a cabinet for enclosing computing equipment is disclosed. The cabinet includes a pair of panels facing each other; and a case positioned in between the panels and configured to receive the computing equipment.

According to various embodiments, each panel includes a sliding track. In some examples, the case includes rollers slidably coupled to the sliding tracks such that the rollers are slidable between first points and second points of the sliding tracks. In some examples, the case is in a first position when the rollers are at the first points, and the case is in a second position when the rollers are at the second points. In some examples, the second position is a position in which the case is within the cabinet in a rotated orientation relative to the first position.

In some examples, a front side of the case facing forward and through which the computing equipment is inserted protrudes from a front side of the cabinet when the case is in the first position. In some examples, the case is configured to receive the computing equipment when the case is in the first position. In some examples, a front side of the received computing equipment, at which an airflow inlet is located, faces forward when the case is in the first position. In some examples, the front side of the received computing equipment faces downward toward ground when the case with the received computing equipment is slid from the first points to the second points and when the case is in the second position.

In some examples, a rear side of the received computing equipment, at which an airflow outlet is located, is directed upward when the case is in the second position such that a direction of airflow is upward from the airflow inlet toward the airflow outlet.

According to certain aspects of the present disclosure, a method for installing computing equipment in a cabinet is disclosed. According to various embodiments, the method includes pulling out a case from the cabinet such that the case in a second position is moved to a first position, the case slidable between the first position and the second position, the first position being a service position in which the case is at least in part external to the cabinet, and the second position being a working position in which the case is within the cabinet in a rotated orientation relative to the first position. The method further includes inserting computing equipment into an open slot of the pulled out case that is in the first position such that a front side of the inserted computing equipment faces forward and moving or rotating the case with the inserted computing equipment by sliding the case inward in the cabinet such that the front side of the received computing equipment faces downward toward ground when the moved or rotated case is in the second position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 4A is a side view of a cabinet, according to certain aspects of the present disclosure.

FIG. 4B is a front view of the cabinet shown in FIG. 4A, according to certain aspects of the present disclosure.

FIG. 8A is a partially transparent perspective view of a case movably coupled to a cabinet and in a first or service position, according to certain aspects of the present disclosure.

FIG. 8B is a partially transparent perspective view of the case shown in FIG. 8A in a second or working position, according to certain aspects of the present disclosure.

Figures 1A, 1B, 1C:
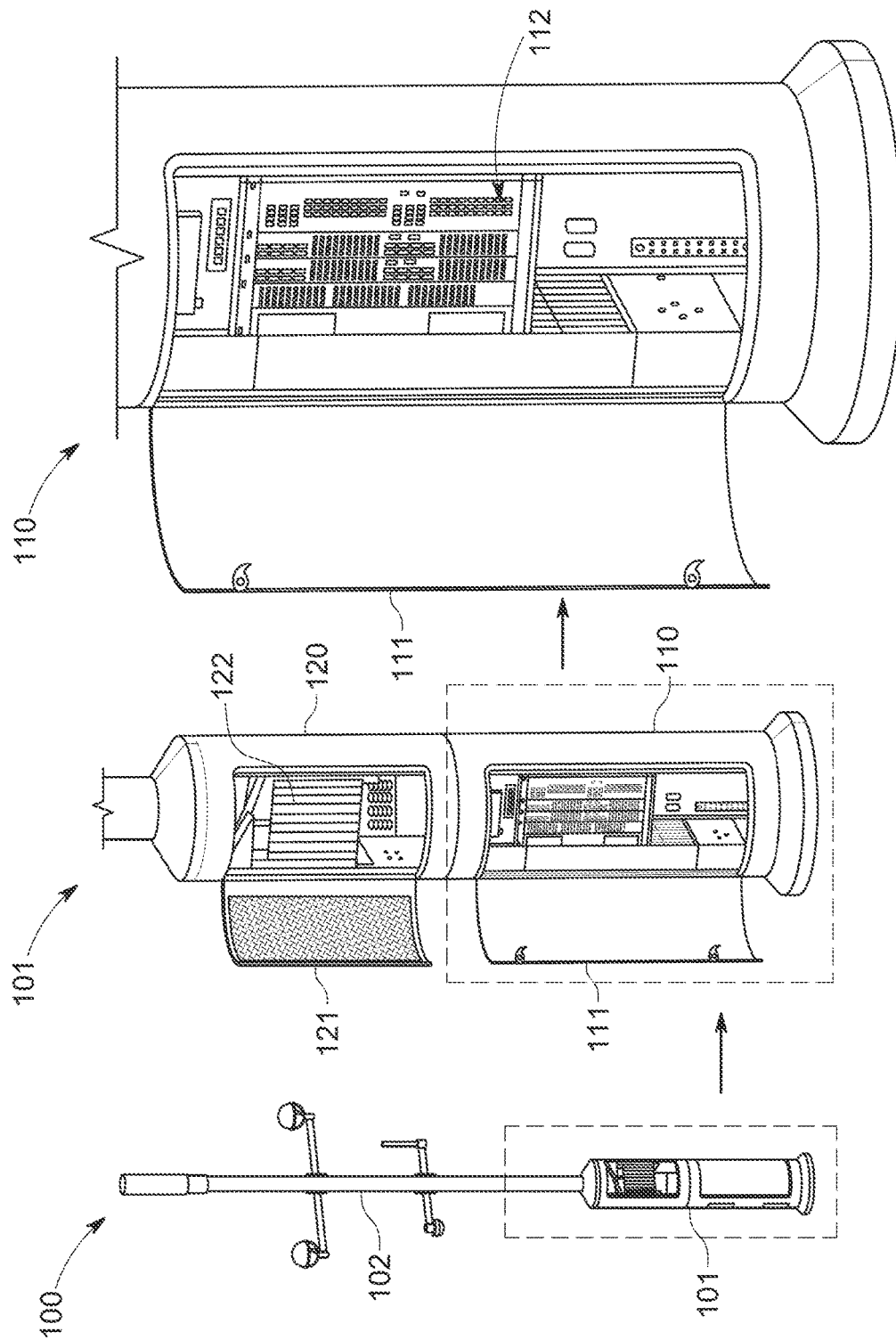
FIG. 1A is a perspective view of a prior art smart pole assembly.
FIG. 1B is a magnified view of a base of the smart pole assembly shown in FIG. 1A.
FIG. 1C is a magnified view of a cabinet in the base of the smart pole assembly shown in FIG. 1B.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure is directed to a smart pole assembly that provides increased performance and more efficient use of the space, at the same time, ensuring an improved airflow design.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figures 3A, 3B:
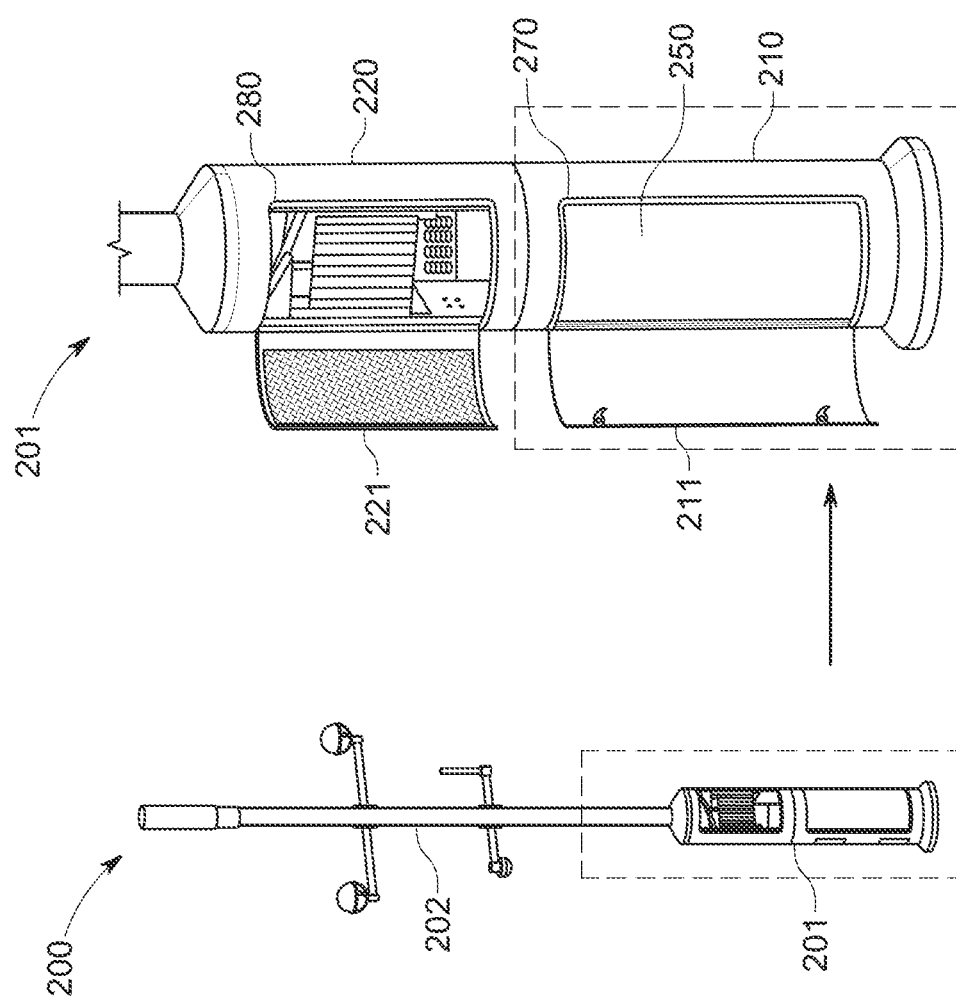
FIG. 3A is a perspective view of a smart pole assembly, according to certain aspects of the present disclosure.
FIG. 3B is a magnified view of a base of the smart pole assembly shown in FIG. 3A.

The external structure of a smart pole assembly 200 according to various embodiments of the present invention is shown in FIGS. 3A and 3B. The smart pole assembly 200 has a base frame 201 and a pole 202 coupled to the base frame 201, as shown in FIG. 3A. The base frame 201 may be configured as a single compartment or double compartments, including a first compartment 210 and a second compartment 220 for enclosing various equipment, as exemplified in FIG. 3B. As shown in FIG. 3B, the first compartment 210 and second compartment 220 have openings 270 and 280, respectively, providing access to the interior spaces, and openable covers 211 and 221 for covering the openings 270 and 280, respectively. In FIG. 3B, a hollow interior space 250 accessible via the opening 270 of the first compartment 210 is shown without a cabinet 230, which is shown in FIGS. 4A-8B.

Figure 2:
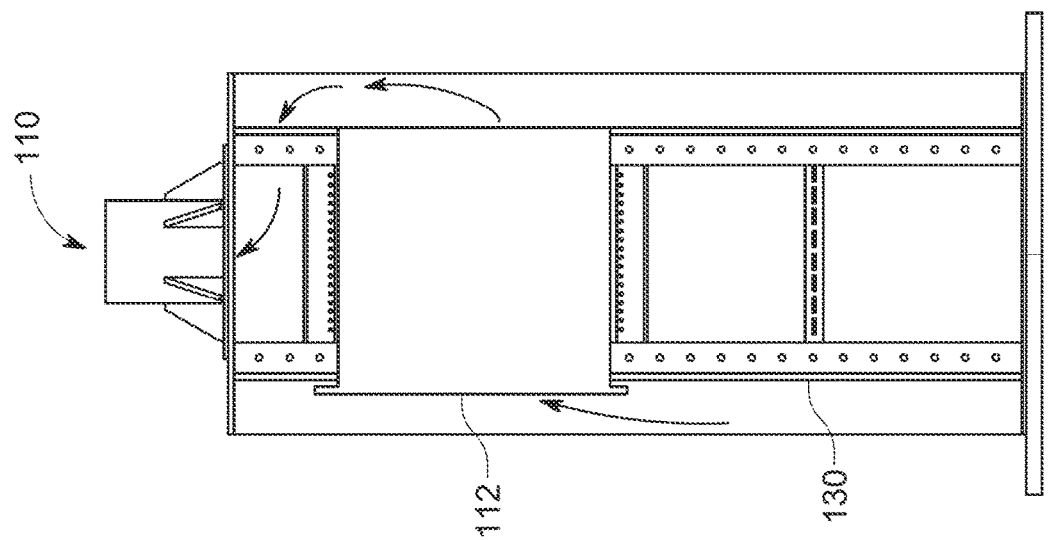
FIG. 2 is a side view of a prior art outdoor cabinet.

Referring to FIGS. 4A and 4B, shown is the hollow interior space 250 of the compartment 210 shown in FIB. 3B at which a cabinet 230 is placed. Computing equipment 212 is installed within the cabinet 230. The orientation of computing equipment 212 installed within the cabinet 230, according to various embodiments of the present invention, is different from the orientation of computing equipment 112 installed within the prior art cabinet 130 shown in FIG. 2. As a result of the different orientation of the computing equipment 212 within the cabinet 230, the airflow direction is also changed. The airflow inlet 213 and airflow outlet 214 of the computing equipment 212 installed vertically within the cabinet 230, as exemplified in FIGS. 4A and 4B, provide much more space near the airflow inlet and outlet compared to the limited space provided by the prior art cabinet 130 shown in FIG. 2. The vertically oriented airflow inlet 213 and airflow outlet 214 of the computing equipment 212 allows receiving airflow from a lower space formed within the cabinet 230. The airflow passes through the airflow inlet 213 and moves upward through the space inside the computing equipment 212, cooling the computing equipment. Eventually, the airflow exiting through the airflow outlet 214 facing upward continues moving upward through an upper space formed within the cabinet 230. Thus, the airflow is in the same upward direction within the space formed within the cabinet 230 without requiring turning the direction of the airflow. As a result, the space 260 formed between an inner surface of the first compartment 210 and the cabinet 230 does not need to be used for the airflow. Instead, the space 260 formed between the inner surface of the first compartment 210 and the cabinet 230 can be used for routing of cables 240 (shown in FIGS. 8A and 8B). Thus, spaces within the cabinet 230 can be used more efficiently, optimizing cooling and providing a sufficient space for cable routing.

Figure 5:
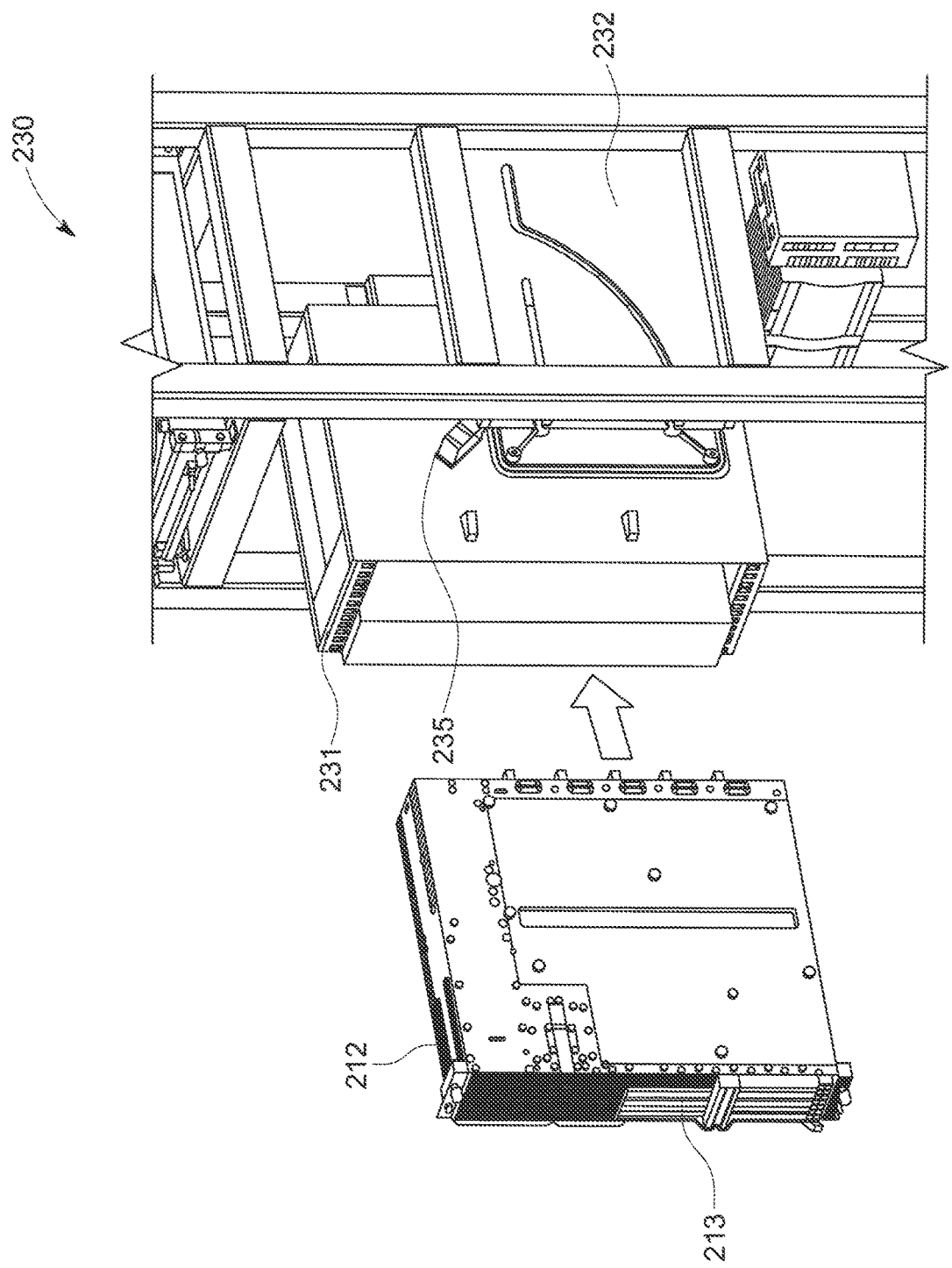
FIG. 5 is a perspective view of a cabinet with a movable case coupled thereto, according to certain aspects of the present disclosure.
Figure 6:
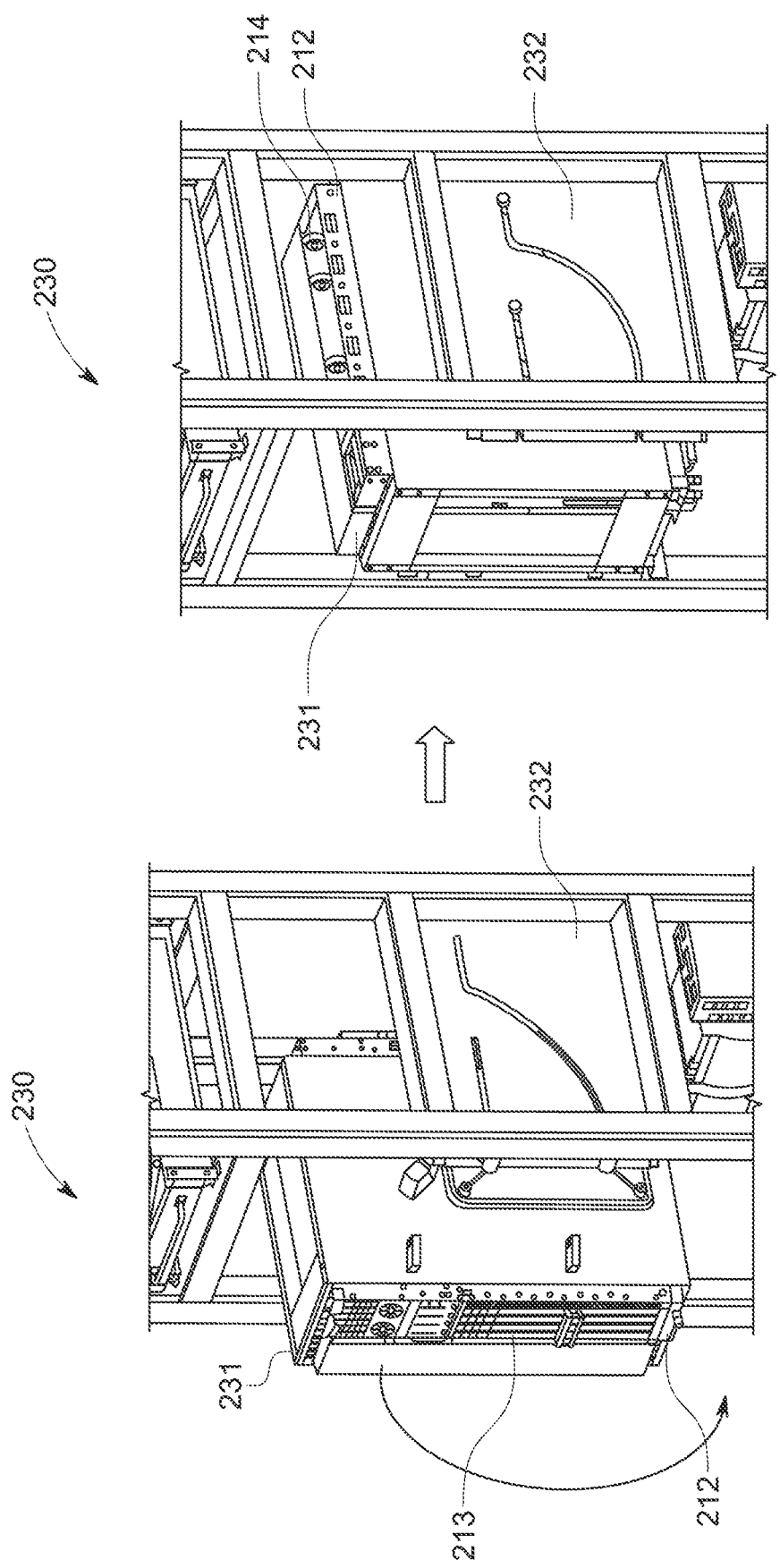
FIG. 6A is a perspective view of a movable case in a first or service position coupled to a cabinet, according to certain aspects of the present disclosure.
FIG. 6B is a perspective view of the movable case shown in FIG. 6A in a second or working position, according to certain aspects of the present disclosure.

According to various embodiments of the present invention, a smart pole assembly 200 for a telecommunication network includes a compartment 210 having a hollow interior space 250, as exemplified in FIGS. 3B, 4A, and 4B. For example, as shown in FIG. 3B, the compartment 210 has an openable cover 211 for covering an opening 270 to the hollow interior space 250, similar to the structure of the prior art smart pole assembly 100 shown in FIGS. 1A, 1B, and 1C. The smart pole assembly 200 further includes a cabinet 230 enclosed within the compartment 210 such that a space 260 is formed between an inner surface of the compartment 210 and the cabinet 230, as shown in FIGS. 4A and 4B. The cabinet 230 is accessible via the opening 270 of the compartment 210. The smart pole assembly 200 further includes a case 231 movably coupled to the cabinet 230, as shown in FIG. 5. The case 231 is configured for receiving computing equipment 212 for operation with the telecommunication network. As shown in FIGS. 6A and 6B, the case 231 is movable between a first position (FIG. 6A) and a second position (FIG. 6B) in response to receiving an external force from a user. In some examples, the first position is a service position in which the case 231 is at least in part external to the cabinet 230. The computing equipment 212 is received when the case 231 is in the first or service position, as exemplified in FIGS. 5 and 6A. In some examples, the second position is a working position in which the case 231 is within the cabinet 230 in a rotated orientation relative to the first position, as exemplified in FIG. 6B.

According to various embodiments of the present invention, a method for installing computing equipment 212 in a cabinet 230 includes opening the cover 211 of the compartment 210 to access the cabinet and pulling out a case 231 from the cabinet. For example, the case 231 that is in a second position, as exemplified in FIG. 6B, is moved to a first position, as exemplified in FIGS. 5 and 6A. For example, the case 231 is slidable between the first position and the second position, as exemplified in FIGS. 6A and 6B. Once the case 231 is pulled out from the cabinet 230 and in the first position, computing equipment 212 is inserted or pushed into an open slot of the case 231, as exemplified in FIG. 5. In some examples, there is pre-existing computing equipment in the case 231, and the computing equipment is pulled out of the pulled out case to generate the open slot. In some example, new or replacement computing equipment is inserted into the open slot instead of the pre-existing equipment. In some examples, the pulled out pre-existing computing is serviced, and then reinserted into the open slot.

When the computing equipment 212 is inserted into the open slot and the case 231 is still in the first position, a front side of the inserted computing equipment 212 faces forward, as shown in FIG. 6A. Further, at least a portion of the case 231 including the front side protrudes from a front side of the cabinet 230 when the case is still in the first position, as shown in FIG. 6A. The protruding configuration of the case 231 will allow easier access to a user servicing the computing equipment 212. Thus, the computing equipment 212 can be serviced while the case 231 enclosing the computing equipment 212 is in the first position. For example, a cable or cables 240 may be coupled to the computing equipment 212 enclosed within the case 231 in the first position.

In some embodiments, both the front side and the rear side of the case 231 are open. In some embodiments, both the top and bottom sides of the case 231 are open. In some embodiments, the front, rear, top, and bottom sides of the case 231 are open.

Once the computing equipment 212 is placed in the case 231 in the first position, as shown in FIG. 6A, the case 231 can be moved or rotated. In some embodiments, the case 231 is moved in response to receiving an external force from a user. In some embodiments, the case 231 is moved by a sliding mechanism. The case 231 is moved inward in the cabinet 230 to be positioned in the second position, as shown in FIG. 6B. In some embodiments, the case 231 is rotated when moving in response to the external force. For example, the case 231 is rotated 90 degrees such that the front side of the computing equipment 212 in the case faces downward toward ground. At this time, the case 231 is in the second position.

In general, an airflow inlet is located at the front side of the computing equipment 212. Therefore, the airflow inlet of the installed computing equipment 212 faces forward when the case 231 is in the first position, as exemplified in FIG. 6A. Further, an airflow outlet is located at a rear side of the computing equipment 212. Thus, the airflow will be in a lateral or horizontal direction if the case 231 with the installed computing equipment 212 stays in the first position similar to the prior art cabinet 130 discussed referring to FIG. 2.

However, by changing the orientation of the computing equipment 212 by rotating the case 231, the lateral or horizontal airflow direction can be changed to an upward or vertical direction. Once the case 231 is in the second position, as shown in FIG. 6B, the airflow inlet of the computing equipment 212 faces downward or toward ground. Also the airflow outlet faces upward when the case 231 is in the second position, as shown in FIG. 6B. Thus, the direction of the airflow is upward from the airflow inlet toward the airflow outlet when the case 231 is in the second position. See FIGS. 4A and 4B showing the airflow direction.

As discussed above referring to FIGS. 2, 4A, and 4B, the upward or vertical airflow direction has advantages over the lateral or horizontal airflow direction. That is, more space is created at or near the airflow inlet and outlet. Further, the upward or vertical airflow direction is in line with the free convection direction, and thus, it is more efficient for cooling the computing equipment 212 than the lateral or horizontal airflow direction. Thus, the orientation of the computing equipment 212 provided by the case 231 in the second position provides optimization and adjustment on cooling solutions. Furthermore, in contrast to the conventional airflow design shown in FIG. 2 in which the same space is used for both airflow and cable routing, the airflow design achieved by the cabinet 230 according to the above discussed embodiments provides separate spaces for airflow and cable routing. Thus, spaces in the smart pole assembly 200 can be used more efficiently.

Figure 7:
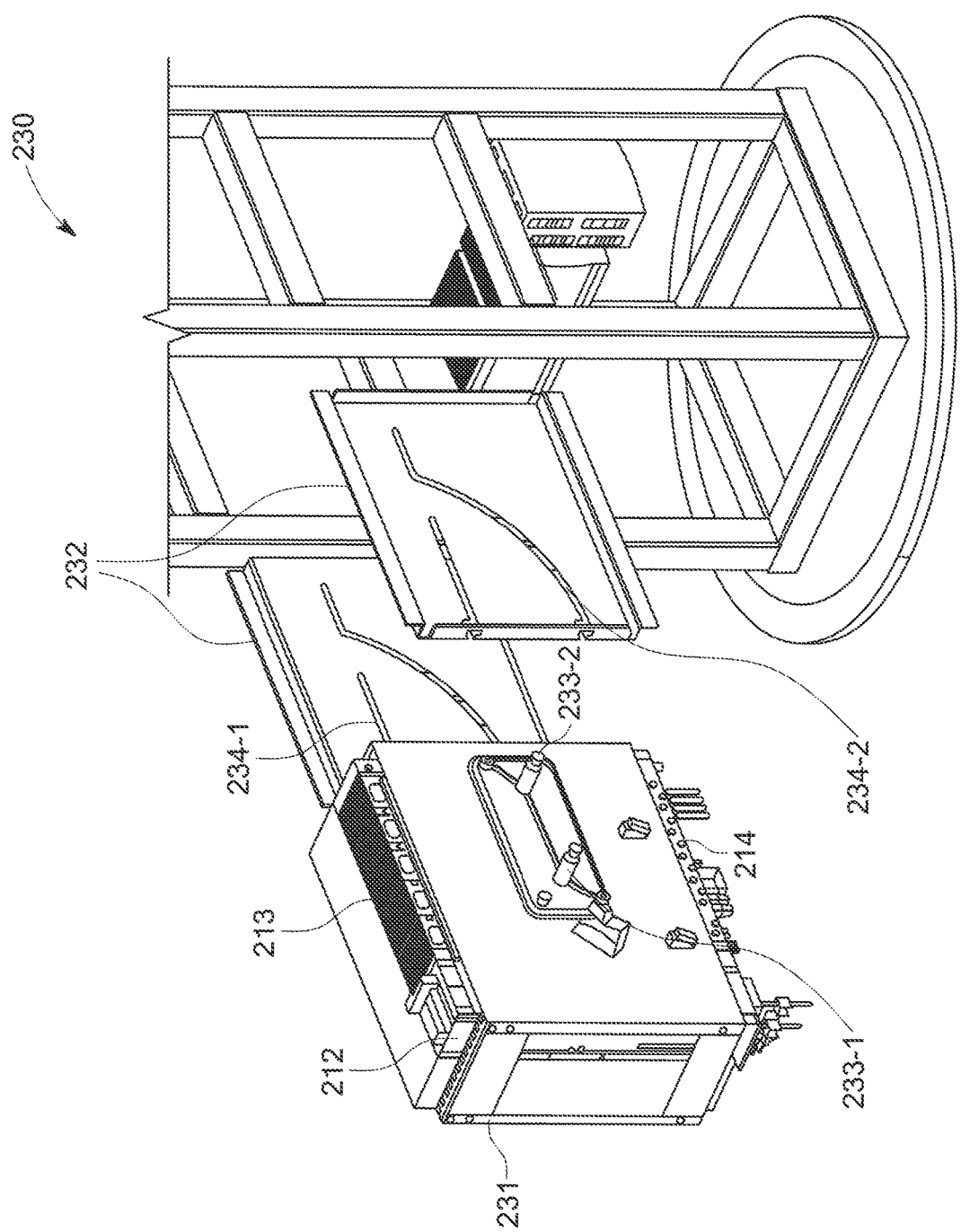
FIG. 7 is a partially exploded view of a cabinet, according to certain aspects of the present disclosure.

According to various embodiments of the present invention, the cabinet 230 includes a pair of panels 232, as shown in FIG. 7. The panels 232 face each other and they are symmetrical. The movable case 231 is positioned between the panels 232. The case 231 is configured to receive the computing equipment 212. Referring to FIG. 7, in some embodiments, each of the panels 232 includes a sliding track 234 such that the case 231 is slidably movable via the sliding tracks 234. The case 231 includes rollers 233 slidably coupled to the sliding tracks 234. In some embodiments, each panel 232 includes two sliding tracks 234-1, 234-2, as exemplified in FIG. 7. For example, a first sliding track 234-1 is straight and a second sliding track 234-2 is at least partially curved or angled with respect to the first sliding track 234-1. The second sliding track 234-2 may also have a straight portion that is aligned with the first sliding track 234-1.

Referring to FIG. 7, in some embodiments, the rollers 233 of the case 231 include a first roller 233-1 slidably coupled to the first sliding track 234-1 and a second roller 233-2 slidably coupled to the second sliding track 234-2. For example, the first and second rollers 233-1, 233-2 protrude from each side of the case 231. The case 231 is in the second position when the rollers 233 of the case that is in the first position are slid to end points of the sliding tracks 234.

Referring to FIGS. 6A and 7, the front side of the case 231 facing forward protrudes from the front side of the cabinet 230 when the rollers 233 of the case 231 that is in the first position are positioned at starting points of the sliding tracks 234. Referring to FIGS. 6B and 7, the front side of the case 231 faces downward toward ground when the rollers 233 are positioned at the end points of the sliding tracks 234 and when the case 231 is in the second position by being rotated from the first position. As exemplified in FIG. 6B, when the case 231 is in the second position, the side of the case that is perpendicular to the front side of the case, now facing downward, does not protrude from the front side of the cabinet 230. In some embodiments, the side of the case 231 that is perpendicular to the front side of the case and the front side of the cabinet 230 are aligned when the case 231 is in the second position.

Referring to FIGS. 6A, 6B, and 7, the case 231 is rotated when the rollers 233 are slid along the sliding tracks 234 from the starting points to the end points. The case 231 is in the vertical orientation when the rollers 233 are at the starting points and when the case 231 is in the first position. The case 231 is in the horizontal orientation when the rollers 233 are at the end points and when the case 231 is in the second position. In some embodiments, the length of the front side of the case 231 and the length of the side of the case that is perpendicular to the front side of the case are different. In some embodiments, the length of the front side of the case 231 is greater than the length of the side of the case that is perpendicular to the front side, as exemplified in FIGS. 6A and 6B.

Referring to FIGS. 8A and 8B, in some embodiments, at least one cable 240 is coupled to the computing equipment 212. In some embodiments, the cable 240 is coupled to the computing equipment 212 while the case 231 is in the first or service position. As shown in FIGS. 8A and 8B, a cable holder 235 is coupled to the case 231 and the cable holder 235 is configured to hold the cable 240 to route the cable 240. In some examples, the cable holder 235 includes a clamp or clip. The cable holder 235 prevents the cable 240 from moving freely within the smart pole assembly 200.

Once the cable 240 is coupled to the computing equipment 212 and held by the cable holder 235 while the case 231 is in the first position, as shown in FIG. 8A, the case 231 is rotated to be placed in the second or working position. In some embodiments, the cable 240 is routed through a space formed between an inner surface of the panel 232 and the side of the case 231. In some embodiments, the cable 240 may also be routed through a space formed outside the cabinet 230 or through a space formed between the cabinet 230 and the inner surface of the compartment 210 of the smart pole assembly 200.

While various embodiments of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

One or more elements or aspects or steps, or any portion (s) thereof, from one or more of any of claims below can be combined with one or more elements or aspects or steps, or any portion(s) thereof, from one or more of any of the other claims or combinations thereof, to form one or more additional implementations and/or claims of the present disclosure.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A smart pole assembly for a telecommunication network, the smart pole assembly comprising:
  a compartment having a hollow interior space, the compartment having an openable cover for covering an opening to the hollow interior space;
  a cabinet enclosed within the compartment, a space being formed between an inner surface of the compartment and the cabinet, the cabinet being accessible via the opening of the compartment; and
  a case movably coupled to the cabinet and configured for receiving computing equipment for operation with the telecommunication network, the case being movable between a first position and a second position in response to receiving an external force from a user, the first position being a service position in which the case is at least in part external to the cabinet, the second position being a working position in which the case is within the cabinet in a rotated orientation relative to the first position, wherein a first side of the case faces a first direction when the case is in the first position, and wherein the case is configured to receive the computing equipment through the first side of the case when the case is in the first position.

2. The smart pole assembly of claim 1, wherein a portion of the case including the first side protrudes from a front side of the cabinet when the case is in the first position.

3. The smart pole assembly of claim 1, wherein a front side of the received computing equipment, at which an airflow inlet is located, faces the first direction when the case is in the first position.

4. The smart pole assembly of claim 3, wherein the front side of the received computing equipment is directed downward toward ground or faces a second direction that is perpendicular to the first direction when the case is moved or rotated from the first position to the second position.

5. The smart pole assembly of claim 4, wherein a rear side of the received computing equipment, at which an airflow outlet is located, is directed upward when the case is in the second position such that a direction of airflow is upward from the airflow inlet toward the airflow outlet.

6. The smart pole assembly of claim 1, wherein the cabinet comprises a pair of panels and the movable case is positioned between the panels.

7. The smart pole assembly of claim 6, wherein each of the panels includes a sliding track such that the case is slidably movable via the sliding tracks.

8. The smart pole assembly of claim 7, wherein the case includes rollers slidably coupled to the sliding tracks.

9. The smart pole assembly of claim 8, wherein:
each panel includes two sliding tracks, a first sliding track being straight and a second sliding track being at least partially curved or angled with respect to the first sliding track; and
the rollers of the case include a first roller slidably coupled to the first sliding track and a second roller slidably coupled to the second sliding track.

10. The smart pole assembly of claim 8, wherein the case is in the second position when the rollers of the case that is in the first position are slid to end points of the sliding tracks.

11. The smart pole assembly of claim 10, wherein:
a first side of the case facing a first direction protrudes from a front side of the cabinet when the rollers of the case that is in the first position are positioned at starting points of the sliding tracks;
the first side of the case faces a second direction that is perpendicular to the first direction when the rollers are positioned at the end points of the sliding tracks and when the case is in the second position; and
a second side of the case that is perpendicular to the first side of the case and facing the first direction does not protrude from the front side of the cabinet when the case is in the second position.

12. The smart pole assembly of claim 11, wherein:
the case is rotated when the rollers are slid along the sliding tracks from the starting points to the end points;
the case is in a vertical orientation when the rollers are at the starting points and when the case is in the first position; and the case is in a horizontal orientation when the rollers are at the end points and when the case is in the second position.

13. The smart pole assembly of claim 12, wherein a length of the first side of the case is greater than a length of the second side of the case.

14. The smart pole assembly of claim 1, further comprising a cable holder coupled to the case and configured to hold a cable.

15. A cabinet for enclosing computing equipment, the cabinet comprising:
a pair of panels facing each other; and
a case positioned in between the panels and configured to receive the computing equipment,
wherein:
each panel includes a sliding track;
the case includes rollers slidably coupled to the sliding tracks such that the rollers are slidable between first points and second points of the sliding tracks;
the case is in a first position when the rollers are at the first points;
the case is in a second position when the rollers are at the second points;
the second position is a position in which the case is within the cabinet in a rotated orientation relative to the first position;
a front side of the case facing forward and through which the computing equipment is inserted protrudes from a front side of the cabinet when the case is in the first position;
the case is configured to receive the computing equipment when the case is in the first position;
a front side of the received computing equipment, at which an airflow inlet is located, faces forward when the case is in the first position; and
the front side of the received computing equipment faces downward toward ground when the case with the received computing equipment is slid from the first points to the second points and when the case is in the second position.

16. The cabinet of claim 15, wherein:
a rear side of the received computing equipment, at which an airflow outlet is located, is directed upward when the case is in the second position such that a direction of airflow is upward from the airflow inlet toward the airflow outlet.

17. A method for installing computing equipment in a cabinet, the method comprising:
pulling out a case from the cabinet such that the case in a second position is moved to a first position, the case slidable between the first position and the second position, the first position being a service position in which the case is at least in part external to the cabinet, and the second position being a working position in which the case is within the cabinet in a rotated orientation relative to the first position;
inserting computing equipment into an open slot of the pulled out case that is in the first position such that a front side of the inserted computing equipment faces forward; and
moving or rotating the case with the inserted computing equipment by sliding the case inward in the cabinet such that the front side of the received computing equipment faces downward toward ground when the moved or rotated case is in the second position.

18. A smart pole assembly for a telecommunication network, the smart pole assembly comprising:

a compartment having a hollow interior space, the compartment having an openable cover for covering an opening to the hollow interior space;

a cabinet enclosed within the compartment, a space being formed between an inner surface of the compartment and the cabinet, the cabinet being accessible via the opening of the compartment; and a case movably coupled to the cabinet and configured for receiving computing equipment for operation with the telecommunication network, the case being movable between a first position and a second position in response to receiving an external force from a user, the first position being a service position in which the case is at least in part external to the cabinet, the second position being a working position in which the case is within the cabinet in a rotated orientation relative to the first position, wherein the cabinet comprises a pair of panels and the movable case is positioned between the panels, wherein each of the panels includes a sliding track such that the case is slidably movable via the sliding tracks, and wherein the case includes rollers slidably coupled to the sliding tracks.

19. A smart pole assembly for a telecommunication network, the smart pole assembly comprising:

a compartment having a hollow interior space, the compartment having an openable cover for covering an opening to the hollow interior space;

a cabinet enclosed within the compartment, a space being formed between an inner surface of the compartment and the cabinet, the cabinet being accessible via the opening of the compartment; and a case movably coupled to the cabinet and configured for receiving computing equipment for operation with the telecommunication network, the case being movable between a first position and a second position in response to receiving an external force from a user, the first position being a service position in which the case is at least in part external to the cabinet, the second position being a working position in which the case is within the cabinet in a rotated orientation relative to the first position, wherein a first side of the received computing equipment faces a first direction when the case is in the first position, and wherein the first side of the received computing equipment faces a second direction that is perpendicular to the first direction when the case is moved from the first position to the second position.

20. A smart pole assembly for a telecommunication network, the smart pole assembly comprising:

a compartment having a hollow interior space, the compartment having an openable cover for covering an opening to the hollow interior space;

a cabinet enclosed within the compartment, a space being formed between an inner surface of the compartment and the cabinet, the cabinet being accessible via the opening of the compartment; and a case movably coupled to the cabinet and configured for receiving computing equipment for operation with the telecommunication network, the case being movable between a first position and a second position in response to receiving an external force from a user, the first position being a service position in which the case is at least in part external to the cabinet, the second position being a working position in which the case is within the cabinet in a rotated orientation relative to the first position, wherein:

the case is in a vertical orientation when the case is in the first position; and the case is in a horizontal orientation when the case is in the second position.

* * * * *